(12) United States Patent  (10) Patent No.: US 10,782,314 B2
Cheng et al.  (45) Date of Patent: Sep. 22, 2020

(54) PROBE ASSEMBLY AND TESTING DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Pijian Cheng, Beijing (CN); Jing Xue, Beijing (CN); Hongyan Xing, Beijing (CN); Yanyan Yin, Beijing (CN); Yue Gu, Beijing (CN); Yubing Song, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 256 days.

(21) Appl. No.: 15/971,484

(22) Filed: May 4, 2018

(65) Prior Publication Data
US 2019/0064212 A1 Feb. 28, 2019

(30) Foreign Application Priority Data

Aug. 31, 2017 (CN) .......................... 2017 1 0772012

(51) Int. Cl.
*G01Q 70/02* (2010.01)
*G01R 1/067* (2006.01)
(Continued)

(52) U.S. Cl.
CPC ............ *G01Q 70/10* (2013.01); *G01Q 70/02* (2013.01); *G01Q 70/14* (2013.01); *G01Q 70/16* (2013.01);
(Continued)

(58) Field of Classification Search
CPC ........ G01Q 70/00; G01Q 70/02; G01Q 70/10; G01Q 70/14; G01Q 70/16; G01R 1/067;
(Continued)

(56) References Cited

U.S. PATENT DOCUMENTS

| 4,001,685 A | * | 1/1977 | Roch | ....................... G01R 1/067 324/754.11 |
| 5,489,855 A | * | 2/1996 | Poisel | ................ G01R 1/06705 324/72.5 |

(Continued)

FOREIGN PATENT DOCUMENTS

| CN | 201335848 Y | 10/2009 |
| CN | 102169159 A | 8/2011 |

(Continued)

OTHER PUBLICATIONS

First Office Action for Chinese Application No. 201710772012.X, dated May 8, 2019, 8 Pages.

(Continued)

*Primary Examiner* — Nguyen Q. Ha
(74) *Attorney, Agent, or Firm* — Brooks Kushman P.C.

(57) ABSTRACT

A probe assembly is provided, which is applied to an electrical testing device. The probe assembly includes a probe body, which includes a testing end configured to contact with a to-be-tested device and a connection end opposite to the testing end; an elastic connection structure configured to be deformed when the probe body is subjected to a pressure; and a fixing base. The connection end is fixedly connected to the fixing base via the elastic connection structure. A testing device is further provided.

20 Claims, 1 Drawing Sheet

(51) Int. Cl.
*G01Q 70/10* (2010.01)
*G01Q 70/14* (2010.01)
*G01Q 70/16* (2010.01)
*G01R 1/073* (2006.01)

(52) U.S. Cl.
CPC ....... *G01R 1/0675* (2013.01); *G01R 1/06705* (2013.01); *G01R 1/06727* (2013.01); *G01R 1/07342* (2013.01)

(58) Field of Classification Search
CPC ............ G01R 1/06705; G01R 1/06727; G01R 1/0675; G01R 1/07342
See application file for complete search history.

(56) References Cited

U.S. PATENT DOCUMENTS

| | | | |
|---|---|---|---|
| 6,361,331 B2 | 3/2002 | Fork et al. | |
| 7,619,429 B2* | 11/2009 | Chou | G01R 1/06711 |
| | | | 324/755.11 |
| 2006/0243483 A1 | 11/2006 | Kirby et al. | |
| 2007/0194803 A1* | 8/2007 | Schwindt | G01R 1/07342 |
| | | | 324/754.03 |
| 2008/0122468 A1* | 5/2008 | Kiesewetter | G01R 1/06705 |
| | | | 324/756.04 |
| 2016/0216321 A1* | 7/2016 | Edwards | G01R 1/07364 |
| 2017/0315151 A1* | 11/2017 | Wang | G01R 1/06716 |
| 2017/0363657 A1* | 12/2017 | Hwu | G01Q 70/04 |

FOREIGN PATENT DOCUMENTS

| | | |
|---|---|---|
| CN | 105093088 A | 11/2015 |
| CN | 105096783 A | 11/2015 |
| TW | 201003077 A | 1/2010 |
| WO | 2017119676 A1 | 7/2017 |

OTHER PUBLICATIONS

1st Chinese Office Action, English Translation.
TW201003077A, English Abstract and Machine Translation.
CN102169159A, English Abstract and Machine Translation.
CN105096783A, English Abstract and Machine Translation.
CN201335848Y, English Abstract and Machine Translation.
CN105093088A, English Abstract and Machine Translation.

* cited by examiner

PROBE ASSEMBLY AND TESTING DEVICE

CROSS-REFERENCE TO RELATED APPLICATION

This application claims priority to Chinese Patent Application No. 201710772012.X filed on Aug. 31, 2017, which is incorporated herein by reference in its entirety.

TECHNICAL FIELD

The present disclosure relates to the field of manufacturing technologies for liquid crystal products, and more particularly, to a probe assembly and a testing device.

BACKGROUND

In an electrical testing device having probe equipment, a probe knob needs to be operated manually when the probe equipment pricks, to make a tip of a probe in contact with a surface of a testing area of a to-be-tested device. Such probe equipment has the following two problems. Whether the probe is in contact with the testing area of the to-be-tested device or not needs to be determined based on visually inspecting a deformation of the probe, and the probe and the testing area are in a rigid contact.

SUMMARY

In a first aspect, the present disclosure provides a probe assembly that is applied to an electrical testing device. The probe assembly includes a probe body, which includes a testing end configured to contact with a to-be-tested device and a connection end opposite to the testing end; an elastic connection structure configured to be deformed in the case that the probe body is subjected to a pressure; and a fixing base, where the connection end is fixedly connected to the fixing base via the elastic connection structure.

Optionally, the elastic connection structure is an elastic connection plate.

Optionally, the probe assembly further includes a rigid supporting structure configured to support the elastic connection structure. The elastic connection structure is connected with the rigid supporting structure in a contacting manner, and one end of the rigid supporting structure is fixedly connected to the fixing base.

Optionally, the rigid supporting structure includes a plate structure.

Optionally, the elastic connection plate includes a first part located beyond the rigid supporting structure and a second part located on the rigid supporting structure, the first part of the the elastic connection plate is close to the connection end of the probe body, and the first part of the elastic connection plate is suspended between the connection end of the probe body and the second part of the elastic connection plate.

Optionally, the probe assembly further includes a fixing member. The fixing member covers an exterior of a junction between the elastic connection plate and the probe body.

Optionally, the probe assembly further includes an extension rod. The extension rod includes, in a lengthwise direction of the extension rod, a first end and a second end opposite to each other, the elastic connection plate and the rigid supporting structure are connected to the first end of the extension rod, and the second end of the extension rod is fixedly connected to the fixing base.

Optionally, the probe assembly further includes a signal line configured to transmit a testing signal of the testing end of the probe body. The signal line has a first end connected with the connection end of the probe body and a second end connected with a signal receiving structure of the electrical testing device.

Optionally, the second end of the signal line penetrates through the extension rod and the fixing base to connect with the signal receiving structure of the electrical testing device, and the signal line is protected by being built in the extension rod and the fixing base.

Optionally, the probe assembly further includes a contact state detecting unit that is configured to detect a contact state between the testing end of the probe body and the to-be-tested device. The contact state detecting unit includes: an indicating unit arranged on the fixing base and configured to indicate the contact state between the testing end and the to-be-tested device, and a controlling unit configured to control the indicating unit to be switched between a first indicating state and a second indicating state. In the case that the testing end of the probe body is not in contact with or is in poor contact with the to-be-tested device, the controlling unit controls the indicating unit to be in the first indicating state. In the case that the testing end of the probe body is in good contact with the to-be-tested device, the controlling unit controls the indicating unit to be in the second indicating state.

Optionally, the controlling unit includes a normally-closed switch. The normally-closed switch includes a movable contact arranged on the elastic connection plate and a stationary contact arranged on the rigid supporting structure. In the case that the elastic connection plate attaches onto the rigid supporting structure, the movable contact is connected with the stationary contact, the normally-closed switch is switched on, and the indicating unit is in the first indicating state. In the case that the elastic connection plate deforms to be separated from the rigid supporting structure, the movable contact is separated from the stationary contact, the normally-closed switch is switched off, and the indicating unit is in the second indicating state.

Optionally, the elastic connection plate is made of a conductive material.

Optionally, the indicating unit includes an indicating lamp, the indicating lamp is off in the case that the indicating unit is in the first indicating state, and the indicating lamp is lighted in the case that the indicating unit is in the second indicating state.

Optionally, the extension rod is a telescopic rod and a length of the telescopic rod is adjustable.

In a second aspect, the present disclosure provides a testing device including the above-mentioned probe assembly.

DETAILED DESCRIPTION

Features and principles of the present disclosure are detailed hereinafter in conjunction with drawings. Enumerated embodiments are merely intended to explain the present disclosure, rather than to limit the present disclosure.

In related technology, whether a tip of a probe is in contact with a surface of a testing area of a to-be-tested device is determined based on visually inspecting a deformation of the probe, which causes additional labor cost and may generate some deviation especially in a case that the tip is too thin to deform visibly. Furthermore, rigid contact between the probe and the testing area may damage the tip of the probe and films on the surface of the testing area. In view of the above, such approach to determine a pricking state based on rigid contact and inspecting a deformation of the probe greatly increases difficulty in testing, and the deformation of the pricking probe may quicken damage to the probe and do harm to deposited films of the surface of the testing area.

In view of the above technical problems, a probe assembly and a testing device are provided according to embodiments of the present disclosure, which solve problems of damage to the probe and damage to the to-be-tested device due to the deformation of the probe.

Figure 1:
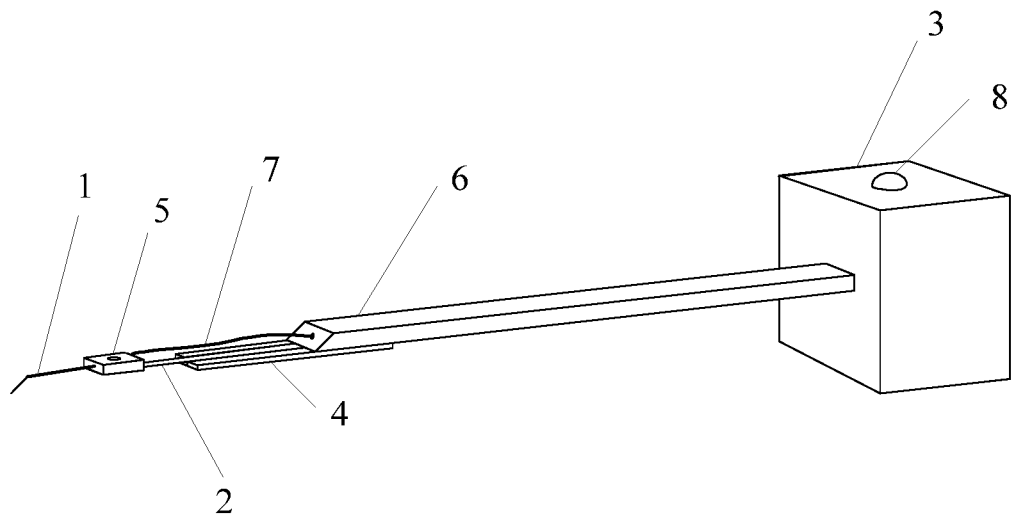
FIG. 1 is a schematic structural diagram of a probe assembly according to some embodiments of the present disclosure.
Figure 2:
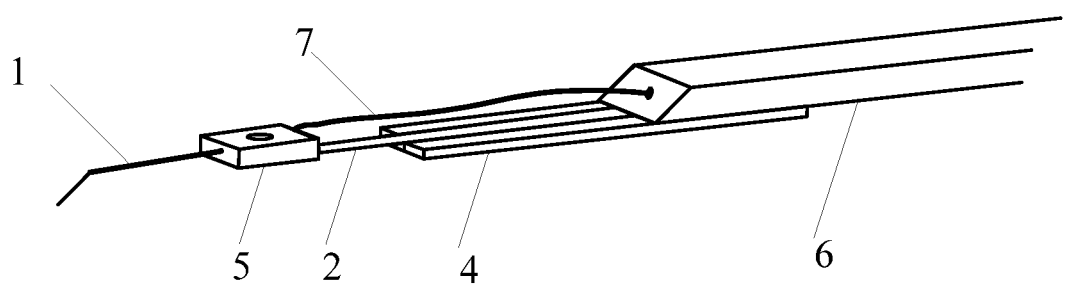
FIG. 2 schematically illustrates a local structure of a probe assembly according to some embodiments of the present disclosure.
Figure 3:
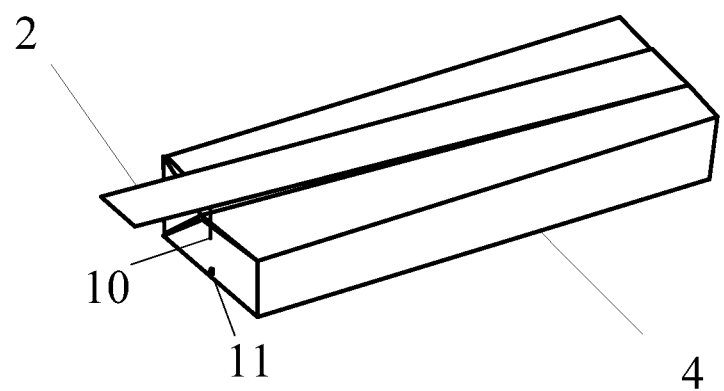
FIG. 3 schematically illustrates an enlarged view of a local structure of a probe assembly according to some embodiments of the present disclosure.

As shown in FIG. 1 to FIG. 3, some embodiments of the present disclosure provide a probe assembly applied to an electrical testing device. The probe assembly includes a probe body 1 having a testing end adapted to contact with a to-be-tested device and a connection end opposite to the testing end; an elastic connection structure 2; and a fixing base 3. The connection end is fixedly connected to the fixing base 3 via the elastic connection structure 2.

The arrangement of the elastic connection structure 2 has a buffering function. When the probe body 1 contacts with the to-be-tested device to perform a test, the elastic connection structure 2 deforms and consequently a pressure applied by the probe onto a surface of the to-be-tested device in contact with the probe is decreased, thereby preventing damage to the probe due to the deformation of the probe itself when the probe 1 is in contact with the to-be-tested device and preventing damage to the to-be-tested device.

The elastic connection structure 2 may have various specific implementations. According to the embodiments, the elastic connection structure 2 is an elastic connection plate.

According to some optional embodiments, in order to decrease the pressure applied by the probe body 1 onto the surface of the to-be-tested device in contact with the probe when the probe 1 is in contact with the to-be-tested device, the elastic connection plate may be designed with a relatively small thickness to increase an elasticity. Optionally, the elastic connection plate may be an elastic strip.

To ensure that a contact between the testing end of the probe body 1 and the to-be-tested device is an elastic contact, the elastic connection plate needs to have a certain elasticity. However, since the probe body 1 itself has a certain gravity, the elastic connection structure 2 may deform even when the probe body 1 is not in an operating state. Hence, a service life of the elastic connection structure 2 is adversely affected, and use of the probe is further affected. In view of the above, according to the embodiments, the probe assembly further includes a rigid supporting structure 4 for supporting the elastic connection plate. The elastic connection plate is connected with the rigid supporting structure 4 in a contacting manner. One end of the rigid supporting structure 4 is connected to the fixing base 3.

The rigid supporting structure 4 may have various implementations. According to the embodiments, the rigid supporting structure 4 is a plate structure, but the rigid supporting structure 4 is not limited thereto.

The elastic connection plate is arranged on the rigid supporting structure 4. When the probe body 1 does not perform a test, the elastic connection plate attaches onto the rigid supporting structure 4. If a length of the elastic connection plate along a lengthwise direction of the probe body 1 is smaller than or equal to a length of the rigid supporting structure 4 along the lengthwise direction of the probe body 1, the probe body 1 is connected with the rigid supporting structure 4 in an abutting way. When the probe body 1 contacts with the to-be-tested device, the pressure applied by the probe body 1 onto the surface of the to-be-tested device in contact with the probe body 1 may not decrease along with a deformation of the elastic connection plate; here, the probe body 1 is apt to be damaged. In view of this, according to the embodiments, the elastic connection plate includes a first part located out of a region of the rigid supporting structure 4 and a second part located on the region of the rigid supporting structure 4. The first part of the elastic connection plate is close to the connection end of the probe body 1. The first part of the elastic connection plate is suspended between the connection end of the probe body and the second part of the elastic connection plate.

According to the embodiments, the probe assembly further includes a fixing member 5. The fixing member 5 covers an exterior of a junction between the elastic connection plate and the probe body 1. The arrangement of the fixing member 5 may protect the junction between the elastic connection plate and the probe body 1.

According to the embodiments, the probe assembly further includes an extension rod 6. The extension rod 6 includes, in its lengthwise direction, a first end and a second end opposite to each other. The elastic connection plate and the rigid supporting structure 4 are connected to the first end of the extension rod 6, and the second end of the extension rod 6 is fixedly connected to the fixing base 3.

The arrangement of the extension rod 6 increases the length of the probe. The probe body 1 can be conveniently applied to a narrow space for testing, thereby extending an application range of the probe.

According to some optional embodiments, the extension rod 6 may be a telescopic rod. The telescopic rod may extend or shorten according to a distance from the probe body 1 to the to-be-tested device.

According to the embodiments, the probe assembly further includes a signal line 7 that is adapted to transmit a testing signal of the testing end of the probe body 1. The signal line 7 has one end connected with the connection end of the probe body 1 and another end connected with a signal receiving structure of the electrical testing device.

According to the embodiments, the another end of the signal line 7 penetrates through the extension rod 6 and the fixing base 3 to connect with the signal receiving structure of the electrical testing device. The signal line 7 is protected by being built in the extension rod 6 and the fixing base 3.

Currently when performing a test, a contact state between the probe body 1 and the to-be-tested device needs to be determined by visually inspecting the deformation of the probe, the test is complicated, the efficiency is low and there exists man-caused deviation. In view of the above, according to the embodiments, the probe assembly further includes a contact state detecting unit that is adapted to detect the contact state between the testing end of the probe body 1 and the to-be-tested device.

The contact state detecting unit includes an indicating unit and a controlling unit. The indicating unit is arranged on the fixing base 3 and is adapted to indicate the contact state between the testing end and the to-be-tested device. The controlling unit is adapted to control the indicating unit to be switched between a first indicating state and a second indicating state. When the testing end of the probe body 1 is not in contact with or is in poor contact with the to-be-tested device, the controlling unit controls the indicating unit to be in the first indicating state. When the testing end of the probe body 1 is in good contact with the to-be-tested device, the controlling unit controls the indicating unit to be in the second indicating state.

With the indicating unit, the contact state between the testing end of the probe body 1 and the to-be-tested device can be obtained intuitively and accurately, the testing efficiency is enhanced, and the testing difficulty is reduced.

According to the embodiments, the controlling unit includes a normally-closed switch. The normally-closed switch includes a movable contact 10 arranged on the elastic connection plate and a stationary contact 11 arranged on the rigid supporting structure 4.

When the elastic connection plate attaches onto the rigid supporting structure 4, the movable contact 10 is connected with the stationary contact 11, the normally-closed switch is closed, and the indicating unit is in the first indicating state under control of the controlling unit. When the elastic connection plate deforms to separate from the rigid supporting structure 4, the movable contact 10 is separated from the stationary contact 11, the normally-closed switch is switched off, and the indicating unit is in the second indicating state under control of the controlling unit.

When the testing end of the probe body 1 is not in contact with or is in poor contact with the to-be-tested device, the elastic connection plate attaches onto the rigid supporting structure 4; here, the movable contact 10 is connected with the stationary contact 11, the normally-closed switch is in a closed state, and the indicating unit is in the first indicating state. When the testing end of the probe body 1 is in contact with the to-be-tested device, the elastic connection plate is separated from the rigid supporting structure 4; here, the movable contact 10 is separated from the stationary contact 11, the normally-closed switch is in a switched-off state, and the indicating unit is in the second indicating state.

As shown in FIG. 2, a lengthwise direction of the probe body 1, a lengthwise direction of the elastic connection structure 2 and a lengthwise direction of the rigid supporting structure 4 are in parallel with each other. The testing end of the probe body 1 inclines downwardly. As shown in FIG. 3, when the testing end of the probe body 1 is in contact with a surface of the to-be-tested device located below the probe body 1, the probe body 1 generates an upward pressure to deform the elastic connection structure 2 upwardly, such that the movable contact 10 arranged on the elastic connection structure 2 is separated from the stationary contact 11 arranged on the rigid supporting structure 4. Here, the normally-closed switch is switched off, and the indicating unit is in the second indicating state under control of the controlling unit.

According to the embodiments, the elastic connection plate is made of a conductive material. The elastic connection plate is embodied into a circuit connected to the indicating unit of the contact state detecting unit, which saves the cost and simplifies the operations.

According to the embodiments, the indicating unit includes an indicating lamp 8. The indicating lamp 8 is off when the indicating unit is in the first indicating state, i.e., the indicating lamp 8 is off when the testing end of the probe body 1 is not in contact with or is in poor contact with the to-be-tested device. The indicating lamp 8 is lighted when the indicating unit is in the second indicating state, i.e., when the testing end of the probe body 1 is in contact with the to-be-tested device. The contact state between the testing end of the probe body 1 and the to-be-tested device can be intuitively illustrated by whether the indicating lamp 8 is lighted or off, which decreases the testing difficulty and improves the testing efficiency.

It should be noted that the indicating unit may include other structures for indicating, for example, a buzzer and so on.

A testing device is further provided according to some embodiments of the present disclosure. The testing device includes the above-described probe assembly.

Optional embodiments of the present disclosure are described hereinabove. It should be noted that the ordinary skilled in the art can make various improvements and polishment without departing from the principle of the present disclosure, and those improvements and polishment should fall within the protection scope of the present disclosure.

What is claimed is:

1. A probe assembly, applied to an electrical testing device, comprising:
   a probe body, which comprises a testing end configured to contact with a to-be-tested device and a connection end opposite to the testing end;
   an elastic connection structure, configured to be deformed in the case that the probe body is subjected to a pressure, wherein the elastic connection structure is an elastic connection plate;
   a fixing base, wherein the connection end is fixedly connected to the fixing base via the elastic connection structure;
   a rigid supporting structure, configured to support the elastic connection plate, wherein the elastic connection plate is connected with the rigid supporting structure in a contacting manner, and one end of the rigid supporting structure is fixedly connected to the fixing base; and
   an extension rod, wherein the extension rod comprises, in a lengthwise direction of the extension rod, a first end and a second end opposite to each other, the elastic connection plate and the rigid supporting structure are connected to the first end of the extension rod, and the second end of the extension rod is fixedly connected to the fixing base.

2. The probe assembly according to claim 1, wherein the elastic connection plate is made of a conductive material.

3. The probe assembly according to claim 1, wherein the extension rod is a telescopic rod and a length of the telescopic rod is adjustable.

4. A testing device, comprising the probe assembly according to claim 1.

5. The probe assembly according to claim 1, wherein the rigid supporting structure comprises a plate structure.

6. The probe assembly according to claim 1, wherein the elastic connection plate comprises a first part located beyond the rigid supporting structure and a second part located on the rigid supporting structure, the first part of the elastic connection plate is close to the connection end of the probe body, and the first part of the elastic connection plate is suspended between the connection end of the probe body and the second part of the elastic connection plate.

7. The probe assembly according to claim 6, further comprising a fixing member, wherein the fixing member covers an exterior of a junction between the elastic connection plate and the probe body.

8. The probe assembly according to claim 1, further comprising a signal line configured to transmit a testing signal of the testing end of the probe body, wherein the signal line has a first end connected with the connection end of the probe body and a second end connected with a signal receiving structure of the electrical testing device.

9. The probe assembly according to claim 8, wherein the second end of the signal line penetrates through the extension rod and the fixing base to connect with the signal receiving structure of the electrical testing device, and the signal line is protected by being built in the extension rod and the fixing base.

10. The probe assembly according to claim 1, further comprising a contact state detecting unit that is configured to detect a contact state between the testing end of the probe body and the to-be-tested device, wherein the contact state detecting unit comprises:
   an indicating unit, arranged on the fixing base and configured to indicate the contact state between the testing end and the to-be-tested device; and
   a controlling unit, configured to control the indicating unit to be switched between a first indicating state and a second indicating state, wherein in the case that the testing end of the probe body is not in contact with or is in poor contact with the to-be-tested device, the controlling unit controls the indicating unit to be in the first indicating state, and in the case that the testing end of the probe body is in good contact with the to-be-tested device, the controlling unit controls the indicating unit to be in the second indicating state.

11. The probe assembly according to claim 10, wherein the controlling unit comprises a normally-closed switch, and the normally-closed switch comprises a movable contact arranged on the elastic connection plate and a stationary contact arranged on the rigid supporting structure;
   wherein in the case that the elastic connection plate attaches onto the rigid supporting structure, the movable contact is connected with the stationary contact, the normally-closed switch is switched on, and the indicating unit is in the first indicating state; and
   wherein in the case that the elastic connection plate deforms to be separated from the rigid supporting structure, the movable contact is separated from the stationary contact, the normally-closed switch is switched off, and the indicating unit is in the second indicating state.

12. The probe assembly according to claim 10, wherein the indicating unit comprises an indicating lamp, the indicating lamp is off in the case that the indicating unit is in the first indicating state, and the indicating lamp is on in the case that the indicating unit is in the second indicating state.

13. A probe assembly, applied to an electrical testing device, comprising:
   a probe body, which comprises a testing end configured to contact with a to-be-tested device and a connection end opposite to the testing end;
   an elastic connection structure, configured to be deformed in the case that the probe body is subjected to a pressure, wherein the elastic connection structure is an elastic connection plate;
   a fixing base, wherein the connection end is fixedly connected to the fixing base via the elastic connection structure;
   a rigid supporting structure, configured to support the elastic connection plate, wherein the elastic connection plate is connected with the rigid supporting structure in a contacting manner, and one end of the rigid supporting structure is fixedly connected to the fixing base; and
   a contact state detecting unit that is configured to detect a contact state between the testing end of the probe body and the to-be-tested device, wherein the contact state detecting unit comprises:
      an indicating unit, arranged on the fixing base and configured to indicate the contact state between the testing end and the to-be-tested device; and
      a controlling unit, configured to control the indicating unit to be switched between a first indicating state and a second indicating state, wherein in the case that the testing end of the probe body is not in contact with or is in poor contact with the to-be-tested device, the controlling unit controls the indicating unit to be in the first indicating state, and in the case that the testing end of the probe body is in good contact with the to-be-tested device, the controlling unit controls the indicating unit to be in the second indicating state.

14. The probe assembly according to claim 13, wherein the elastic connection plate comprises a first part located beyond the rigid supporting structure and a second part located on the rigid supporting structure, the first part of the elastic connection plate is close to the connection end of the probe body, and the first part of the elastic connection plate is suspended between the connection end of the probe body and the second part of the elastic connection plate.

15. The probe assembly according to claim 14, further comprising a fixing member, wherein the fixing member covers an exterior of a junction between the elastic connection plate and the probe body.

16. The probe assembly according to claim 13, further comprising an extension rod, wherein the extension rod comprises, in a lengthwise direction of the extension rod, a first end and a second end opposite to each other, the elastic connection plate and the rigid supporting structure are connected to the first end of the extension rod, and the second end of the extension rod is fixedly connected to the fixing base.

17. The probe assembly according to claim 16, further comprising a signal line configured to transmit a testing signal of the testing end of the probe body, wherein the signal line has a first end connected with the connection end of the probe body and a second end connected with a signal receiving structure of the electrical testing device.

18. The probe assembly according to claim 17, wherein the second end of the signal line penetrates through the extension rod and the fixing base to connect with the signal receiving structure of the electrical testing device, and the signal line is protected by being built in the extension rod and the fixing base.

19. The probe assembly according to claim 13, wherein the controlling unit comprises a normally-closed switch, and the normally-closed switch comprises a movable contact arranged on the elastic connection plate and a stationary contact arranged on the rigid supporting structure;
   wherein in the case that the elastic connection plate attaches onto the rigid supporting structure, the movable contact is connected with the stationary contact, the normally-closed switch is switched on, and the indicating unit is in the first indicating state; and
   wherein in the case that the elastic connection plate deforms to be separated from the rigid supporting structure, the movable contact is separated from the stationary contact, the normally-closed switch is switched off, and the indicating unit is in the second indicating state.

20. The probe assembly according to claim 13, wherein the indicating unit comprises an indicating lamp, the indicating lamp is off in the case that the indicating unit is in the first indicating state, and the indicating lamp is on in the case that the indicating unit is in the second indicating state.

\* \* \* \* \*